US012596156B2

(12) United States Patent
Gaspari

(10) Patent No.: US 12,596,156 B2
(45) Date of Patent: Apr. 7, 2026

(54) SPARE PART SYSTEM FOR MAINTAINING AVAILABILITY OF SPARE PARTS FOR AN ELECTRIC POWER SUPPLY SYSTEM

(71) Applicant: NEXANS, Courbevoie (FR)

(72) Inventor: Roberto Gaspari, Oslo (NO)

(73) Assignee: NEXANS, Courbevoie (FR)

( * ) Notice: Subject to any disclaimer, the term of this patent is extended or adjusted under 35 U.S.C. 154(b) by 137 days.

(21) Appl. No.: 18/640,358

(22) Filed: Apr. 19, 2024

(65) Prior Publication Data

US 2024/0385259 A1 Nov. 21, 2024

(30) Foreign Application Priority Data

Apr. 21, 2023 (EP) ..................................... 23315097

(51) Int. Cl.
*G01R 31/40* (2020.01)
*G01R 31/00* (2006.01)
(52) U.S. Cl.
CPC ........... *G01R 31/40* (2013.01); *G01R 31/003* (2013.01)
(58) Field of Classification Search
CPC ......... G01R 31/40; G01R 31/003; H02J 9/06; H02J 13/00002; H02J 3/00
See application file for complete search history.

(56) References Cited

U.S. PATENT DOCUMENTS

| | | | | |
|---|---|---|---|---|
| 2014/0156323 A1* | 6/2014 | Prieto | ................ | G06Q 10/0631 705/7.12 |
| 2016/0006242 A1* | 1/2016 | Yamada | .................... | H02J 1/14 307/65 |
| 2019/0286965 A1* | 9/2019 | Lovell | .............. | G06K 19/07758 |
| 2019/0376991 A1* | 12/2019 | Rudorfer | .......... | G01N 35/00871 |
| 2023/0083724 A1* | 3/2023 | Cella | ................ | G06F 16/24537 705/28 |
| 2023/0288497 A1* | 9/2023 | Cook | ..................... | G01R 31/58 |

FOREIGN PATENT DOCUMENTS

| | | |
|---|---|---|
| CN | 208 400 170 | 1/2019 |
| WO | 2004/088508 | 10/2004 |

OTHER PUBLICATIONS

European Search Report dated Oct. 10, 2023.

* cited by examiner

*Primary Examiner* — Alvaro E Fortich
(74) *Attorney, Agent, or Firm* — CANTOR COLBURN LLP

(57) ABSTRACT

A spare part system (1) for maintaining availability of spare parts (110, 120) for an electric power supply system (PSS) has a first set of spare parts (110) having a first remaining lifespan time (T1) and a second set of spare parts (120) having a second remaining lifespan time (T2) being shorter than the first remaining lifespan time (T1). The spare part system (1) has a monitoring system (10) for monitoring the status of the first set of spare parts (110) and the second set of spare parts (120). This monitoring system (10) has a monitoring unit (20) located together with the first set of spare parts (110) and the second set of spare parts (120) having a sensor (21) and a communication unit (23) and a monitoring central (30) provided in communication with the communication unit (23) of the monitoring unit (20). The monitoring unit (20) is configured to send a message to the monitoring central (30) if a condition is present.

12 Claims, 6 Drawing Sheets

1

1
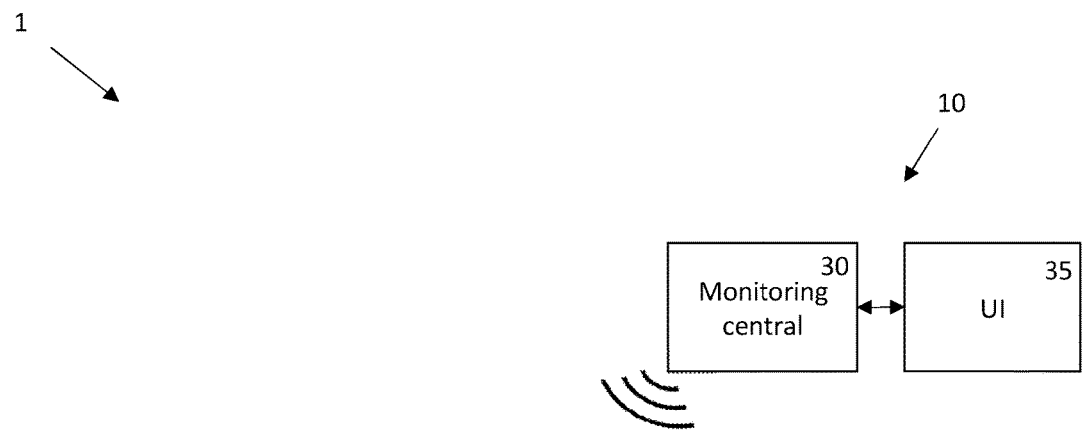
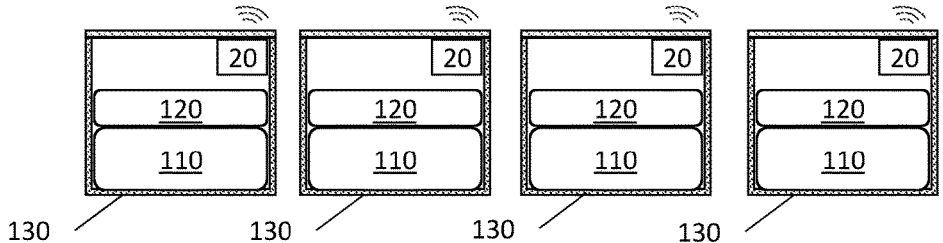
Fig. 2

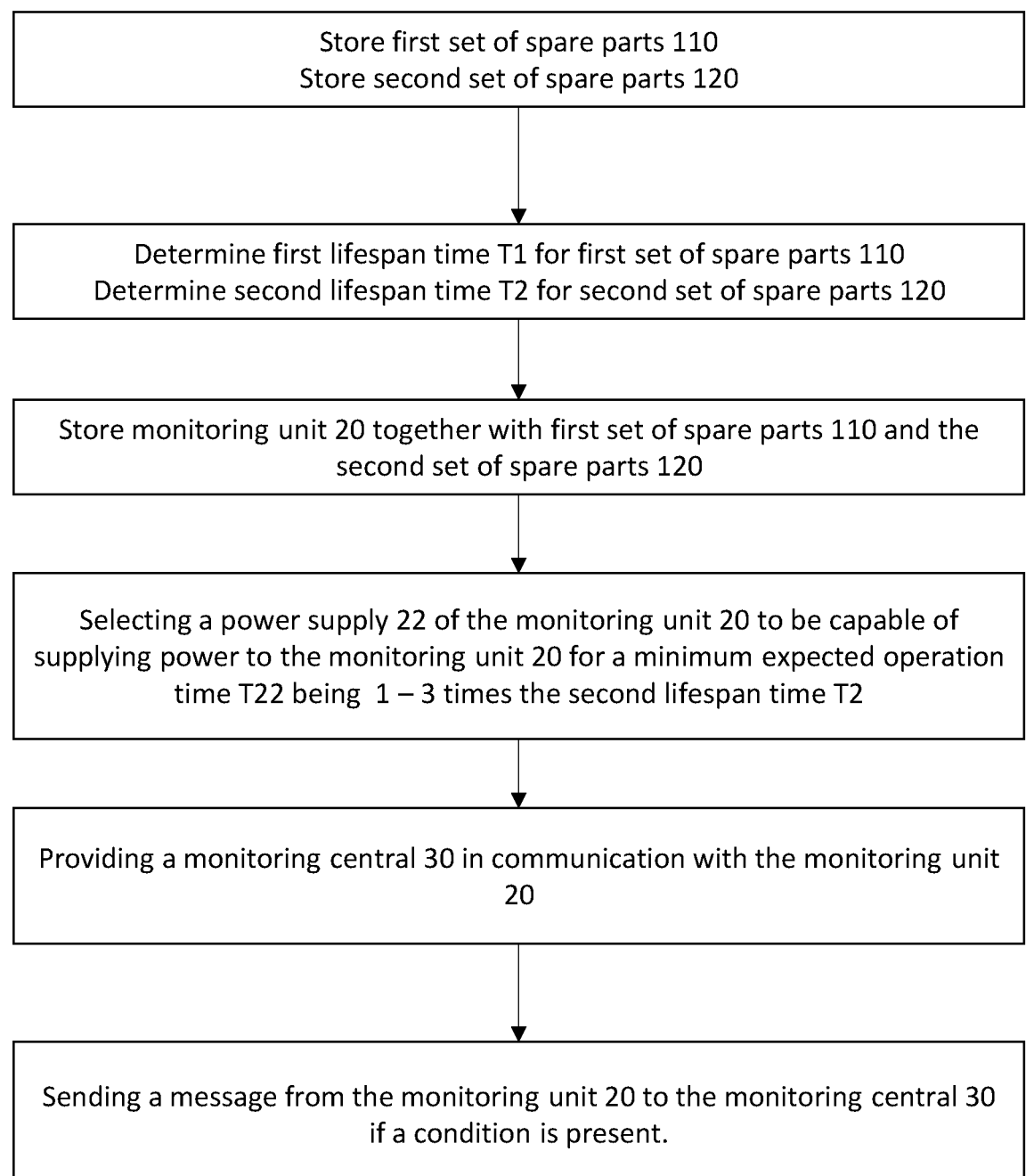

Store first set of spare parts 110
Store second set of spare parts 120

Determine first lifespan time T1 for first set of spare parts 110
Determine second lifespan time T2 for second set of spare parts 120

Store monitoring unit 20 together with first set of spare parts 110 and the second set of spare parts 120

Selecting a power supply 22 of the monitoring unit 20 to be capable of supplying power to the monitoring unit 20 for a minimum expected operation time T22 being 1 − 3 times the second lifespan time T2

Providing a monitoring central 30 in communication with the monitoring unit 20

Sending a message from the monitoring unit 20 to the monitoring central 30 if a condition is present.

Fig. 5

SPARE PART SYSTEM FOR MAINTAINING AVAILABILITY OF SPARE PARTS FOR AN ELECTRIC POWER SUPPLY SYSTEM

RELATED APPLICATION

This application claims the benefit of priority from European Patent Application No. 23 315 097.8, filed on Apr. 21, 2023, the entirety of which is incorporated by reference.

FIELD OF THE INVENTION

The present invention relates to a spare part system for maintaining availability of spare parts for an electric power supply system. The present invention also relates to a method for maintaining availability of spare parts for an electric power supply system. The present invention also relates to a monitoring system for monitoring the status of a first set of spare parts and a second set of spare parts of an electric power supply system.

BACKGROUND OF THE INVENTION

Most electric power supply systems are designed in detail for its specific purpose. As such electric power supply systems are critical for society and/or for business, there are often requirements for maximum downtime, power grid system operators issue fines for non-delivered power, etc.

Parts of an electrical power supply system may have a lifespan of 30-50 years. In addition, the manufacturing and transportation time for some parts of an electrical power supply system may be 1-3 months.

Hence, owners or operators of electrical power supply systems have mission critical spare parts stored at one or different locations in order to be able to reduce the time needed to repair a fault should a fault occur.

One object of the present invention is to provide a spare part system for maintaining availability of spare parts for an electric power supply system.

SUMMARY OF THE INVENTION

The present invention relates to a spare part system for maintaining availability of spare parts for an electric power supply system, wherein the spare part system comprises:
- a first set of spare parts having a first remaining lifespan time;
- a second set of spare parts having a second remaining lifespan time being shorter than the first remaining lifespan time;
- a monitoring system for monitoring the status of the first set of spare parts and the second set of spare parts;

wherein the monitoring system comprises:
- a monitoring unit located together with the first set of spare parts and the second set of spare parts; wherein the monitoring unit comprises a sensor and a communication unit;
- a monitoring central provided in communication with the communication unit of the monitoring unit;

wherein the monitoring unit is configured to send a message to the monitoring central if a condition is present,
wherein the monitoring unit comprises a power supply, wherein the power supply is defined with a minimum expected operation time for which the power supply is capable of powering the monitoring unit and the minimum expected operation time for the power supply is 1-3 times the second remaining lifespan time.

The monitoring central may be a computer type of infrastructure, a server type of infrastructure or a cloud-based type of infrastructure.

The first set of spare parts having a first remaining lifespan time may be referred to as long-lifespan spare parts. The second set of spare parts having a second remaining lifespan time may be referred to as short-lifespan spare parts.

The second remaining lifespan time may be between 2-4 years. The first remaining lifespan time may be more than ten times the second remaining lifespan time. The first remaining lifespan time may be more than 20-40 years. The minimum expected operation time may be 2-12 years, dependent on the second remaining lifespan time.

When the minimum expected operation time is substantially equal to the second remaining lifespan time, the power supply may be replaced every time the second set of spare parts is resupplied.

When the minimum expected operation time is substantially equal to two times the second remaining lifespan time, the power supply may be replaced every second time the second set of spare parts is resupplied.

When the minimum expected operation time is substantially equal to three times the second remaining lifespan time, the power supply may be replaced every third time the second set of spare parts is resupplied.

As used herein, the term "minimum expected operation time" for a part is referring to a time period from the point in time at which a part has been put in operation and until a point in time when it is expected that the part is no longer working as required.

As used herein, the term "remaining lifespan time" for a part is referring to a time period up till the last point in time at which a spare part is suitable for being used as a spare part for the electric power supply system. When a spare part has been installed in the power supply system, it is per definition no longer a spare part anymore. However, the part installed in the power supply system may have a minimum expected operation time after its installation in the power supply system.

As used herein, the term "resupply" is used to denote the operation of replacing spare parts having an expired or imminent expiration date with spare parts having a future expiration date, in order to avoid that spare parts with expired expiration date will be used to repair a fault should a fault occur while guaranteeing the continuous availability of beforementioned spare part for immediate repair.

The spare part system may comprise a third set of spare parts having a third remaining lifespan time being shorter than the first remaining lifespan time and longer than the second remaining lifespan time.

The first set of spare parts and the second set of spare parts may be considered as mission critical spare parts. Also the third set of spare parts may be considered as mission critical spare parts.

As used herein, the term "mission critical" is used to denote any essential spare part needed to be able to repair a fault within a predetermined maximum downtime.

The first set of spare parts may be stored within a container, the second set of spare parts may be stored separately from the first set of spare parts within the container, and the monitoring unit may be located adjacent to the second set of spare parts within the container.

The monitoring unit may be located above or next to the first set of spare parts. The monitoring unit may be located above or next to the second set of spare parts.

The container may define a storage compartment having a top opening. The container may comprise a closure for covering the top opening. The monitoring unit may be accessible via the top opening when the closure is removed from the container.

The container may be a crate, a box, a barrel, a can, a bag etc.

The monitoring unit may be secured to the inside of the container. The monitoring unit may be secured to the inside of the closure.

The first set of spare parts may be stored within a first bag within the container. The second set of spare parts may be stored within a second bag within the container. The first bag and/or the second bag may be a gastight and/or watertight bag to protect the spare parts.

The sensor may be one or more of the following:

a position sensor for sensing a parameter representative of a position of the first set of spare parts and/or the second set of spare parts; or a movement sensor for sensing a parameter representative of a movement of the first set of spare parts and/or the second set of spare parts; or a tampering sensor for sensing a parameter representative of tampering of the first set of spare parts and/or the second set of spare parts; or an environment sensor for sensing a parameter representative of the storage environment of the first set of spare parts and/or the second set of spare parts; or a shock sensor for sensing a parameter representative of a shock experienced by the first set of spare parts and/or the second set of spare parts.

The message sent from the monitoring unit to the monitoring central may comprise the parameter sensed by the sensor.

The message may comprise the parameter sensed by the sensor as a function of time.

The condition may be that the parameter sensed by the sensor is above or below a threshold value.

The condition may be predetermined. The condition may be changed dependent on the parameter sensed by the sensor. The condition may be changed manually by the monitoring central.

In case the sensor is a position sensor in the form of a GPS sensor, the threshold value may be a geographic area. If the position sensed by the sensor is outside of the geographic area, a message is sent to the monitoring central.

In case the sensor is a movement sensor in the form of an inclinometer, the threshold value may be an inclination value or an averaged inclination value. If the movement sensed by the sensor is above the inclination value or the averaged inclination value, a message is sent to the monitoring central. The movement sensor may be a GPS sensor. The movement sensor may be a gyroscope. The movement sensor may be a multi-axis accelerometer.

In case the sensor is a tampering sensor in the form of a switch for detecting if the lid has been removed from the container, the threshold value may be Boolean value. If the Boolean value of the switch changes, a message is sent to the monitoring central. The tampering sensor may be a proximity sensor. The tampering sensor may be an IR sensor. The tampering sensor may be an ultrasonic sensor. The tampering sensor may be a light sensor. The tampering sensor may be an electrical switch or a mechanical switch.

In case the sensor is an environment sensor in the form of a temperature sensor, the threshold value may be a temperature threshold or an average temperature threshold. If the temperature sensed by the sensor is above or below the temperature threshold or the average temperature threshold, a message is sent to the monitoring central. The environment sensor may be a humidity sensor. The sensor may be a water leakage sensor.

In case the sensor is a shock sensor in the form of an acceleration sensor, the threshold value may be an acceleration threshold or an averaged acceleration threshold. If the acceleration sensed by the sensor is above the acceleration threshold or the averaged acceleration threshold, a message is sent to the monitoring central. The shock sensor may be a drop sensor for sensing a drop of the sensor.

In any of the above cases, the parameter sensed by the sensor may indicate that there is a risk that the spare parts are no longer at their location, that the spare parts have been damaged, that the spare parts have reduced remaining lifespan time when compared with their original expected remaining lifespan time etc. Hence, actions should be taken in order to check if the spare part system needs new spare parts in order to ensure availability of spare parts should a fault occur.

The condition may be a point of time. Hence, the monitoring unit may be configured to send the message to the monitoring central at a point of time.

The point of time may be defined by a time schedule. The time schedule may be predetermined. The time schedule may be changed by the monitoring unit or by the monitoring central based on the parameter sensed by the sensor. The time schedule may be changed based on communication with the monitoring central.

The power supply may be a battery or a rechargeable battery. The power supply may be connected to the mains.

The monitoring central may be connected to a user interface. The condition may be changed via the user interface. The content and format of the message may be changed via the user interface. Such changes may be communicated to the monitoring unit via the monitoring central.

The spare part system may comprise an electronic label located at an available location together with the first set of spare parts and the second set of spare parts, and the electronic label may be provided in communication with the monitoring unit.

The electronic label may be secured to the outside of the container.

The monitoring unit may have a unique identifier. The unique identifier may be displayed on the electronic label. Information about the first set of spare parts and a second set of spare parts may be retrieved by the monitoring central based on the unique identifier. The available location may be a visible location.

The spare part system may comprise an interrogation unit for local interrogation of the monitoring unit and/or the electronic label.

The interrogation unit may be an NFC reader and the electronic label may be an NFC tag. The interrogation unit may be an image sensor and the electronic label may be a configured to display an image. The image may be a QR code.

The interrogation unit may comprise a communication unit for communication with the monitoring central.

The condition may be that a remaining operation time for the power supply may be less than the expected remaining operation time for the power supply.

The condition may be that a fault has occurred in the power supply. The condition may be that the energy level of the power supply is below a threshold value.

The monitoring unit may comprise a processing unit connected to the sensor and the communication unit, wherein the power supply may be supplying power to the processing unit.

The processing unit and the communication unit may be the same unit. The processing unit may comprise a timer for measuring time. The sensor may comprise a timer for measuring time. The communication unit may comprise a timer for measuring time.

The present invention also relates to a method for maintaining availability of spare parts for an electric power supply system, wherein the method comprises the steps of:

storing a first set of spare parts;

storing a second set of spare parts together with the first set of spare parts;

determining a first remaining lifespan time for the first set of spare parts;

determining a second remaining lifespan time for the second set of spare parts, wherein the second remaining lifespan time is shorter than the first remaining lifespan time;

storing a monitoring unit comprising a sensor and a communication unit together with the first set of spare parts and the second set of spare parts;

selecting a power supply of the monitoring unit to be capable of supplying power to the sensor and the communication unit for a minimum expected operation time being 1-3 times the second remaining lifespan time;

providing a monitoring central in communication with the monitoring unit;

sending a message from the monitoring unit to the monitoring central if a condition is present.

The present invention also relates to a monitoring system for monitoring the status of a first set of spare parts and a second set of spare parts of an electric power supply system, wherein the monitoring system comprises:

a monitoring unit located together with the first set of spare parts and the second set of spare parts;

a monitoring central provided in communication with the monitoring unit;

wherein the monitoring unit comprises a sensor, a power supply, a communication unit and a processing unit;

wherein the monitoring unit is configured to send a message to the monitoring central if a condition is detected by the sensor, the power supply and/or the processing unit.

LIST OF DRAWINGS

FIG. 2 illustrates a first embodiment of a spare part system schematically;

FIG. 5 illustrates a flow chart of the method;

DETAILED DESCRIPTION

Figure 1:
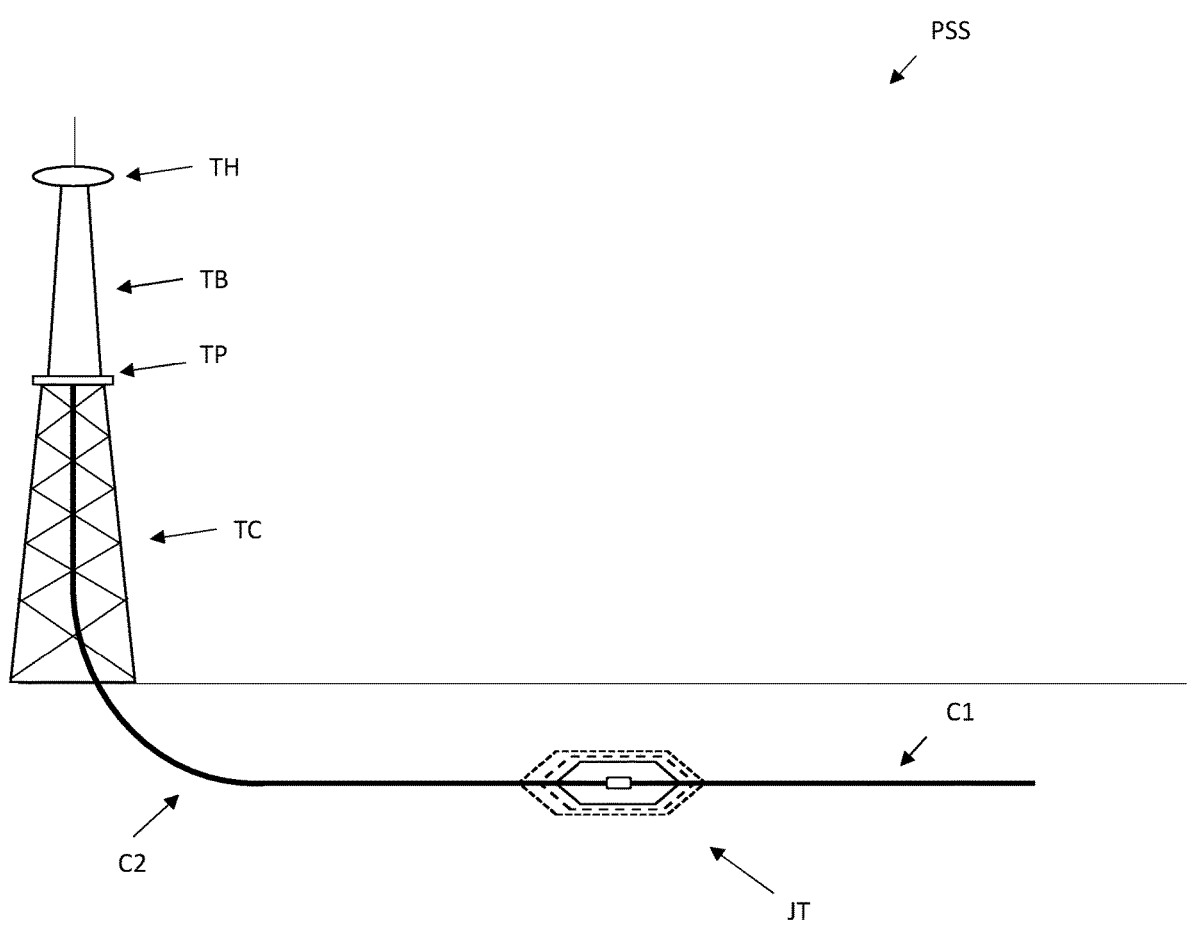
FIG. 1 illustrates schematically an example of some parts of an electric power supply system.

It is now referred to FIG. 1, where an example of an electric power supply system PSS is shown. The electric power supply system PSS here comprises a first cable section C1 and a second cable section C2 jointed at a land joint JT. The second cable section C2 is guided up via a termination scaffold TC to a termination plate TP, a termination body TB and a field shaping termination hat TH.

An owner or operator of the electric power supply system PSS will have a storage of mission critical spare parts for the power supply system in order to be able to reduce the time needed to repair a fault should a fault occur.

As an example, should a fault in the land joint JT occur, a spare joint will contain the following main spare parts:

a conductor connection;

a pre-molded joint (PMJ);

a metallic enclosure;

a carapace.

In addition, other smaller parts are required, in addition to chemical products, such as glue, oils, silicone etc., which will be needed for the operation of replacing the land joint. Hence, such chemical products are also considered to represent spare parts.

All of the above spare parts for the land joint are typically referred to as mission critical spare parts, as they are all necessary to repair the fault within a required time window. It should be noted that the definition of whether or a spare part is a mission critical spare part or not may vary. As an example, if the above land joint is located in a densely populated area, tools required for the operation of replacing the land joint may not be considered mission critical, as it can be assumed that such tools are in daily or weekly use by service personnel in the densely populated area and can be brought to the location of the land joint within acceptable time. However, in remote areas, for example an offshore wind farm etc., also tools and possibly also safety equipment (clothing, helmets, harnesses etc.) for the service personnel may be considered mission critical spare parts.

It is now referred to FIG. 2, where a spare part system 1 is shown schematically. The spare part system 1 comprises a first set of spare parts 110 and a second set of spare parts 120.

The first set of spare parts 110 is different from the second set of spare parts 120 in their remaining lifespan time. The first set of spare parts 110 has a first remaining lifespan time T1, while the second set of spare parts has a second remaining lifespan time T2. The remaining lifespan times T1, T2 are shown in the flow chart of FIG. 5.

The first set of spare parts 110 has a remaining lifespan time T1 of more than 20 years. Non-limiting examples of the first set of spare parts 110 are:

conductor sleeves, corona shields, PMJ units, outer casings, insulating flanges, coffin boxes, tailor-made pre-moulded body parts (which are rubber sleeves put over the conductor joint to smooth the electrical field), tailor-made pre-moulded termination sleeves (which are put over the conductor joint in a termination to smooth the electrical field), connector joints for the conductor (metallic sleeve where the two extremities of the conductor are inserted to be welded or screwed together, which must match the conductor size/type of material and is designed for a specific pulling axial force), metallic enclosure parts (each joint shall be covered by a full metallic enclosure to protect from water ingress, here dimensions are tailored to the type and dimensions of the cables), carapaces (designed to protect the joint from humidity or access), stress relief cones, hollow insulators, sealing unit post insulators, lower metal cases, termination body (specific to voltage and cable design), field shaping termination top (to shape the electrical field and minimize the risk of local discharge or corona), termination plates (where the termination is fixed from the top and the cable is attached on the bottom, which are also specific to the geometry of the cable), clamps, collars for joints and cables (e.g. to hang the cable under the termination), etc.

The second remaining lifespan time T2 of the second set of spare parts 120 is between 2-4 years. Hence, the first remaining lifespan time T1 is more than ten times the second remaining lifespan time T2, i.e. more than 20-40 years.

Non-limiting examples of the second set of spare parts 120 are:

chemical products such as filling oils, filling compounds, lubricants, sealants, glue, etc.

tapes such as metallic tapes, plastic tapes, self-amalgamating tapes etc.

In FIG. 2 it is further shown that the spare part system 1 comprises containers in the form of containers 130 in which the above first set of spare parts 110 and second set of spare parts 120 are stored.

By storing the first set of spare parts together with the second set of spare parts within such containers, it may be achieved that all spare parts required to perform the repair are actually available. In addition, it may be achieved that fewer containers must be transported to the location of the fault. Spare parts may be organized within the container according to the sequence they are needed to perform the repair. Hence, efficiency may be increased. In addition, fewer containers need to be opened simultaneously during the repair. This may also increase efficiency.

Figure 3:
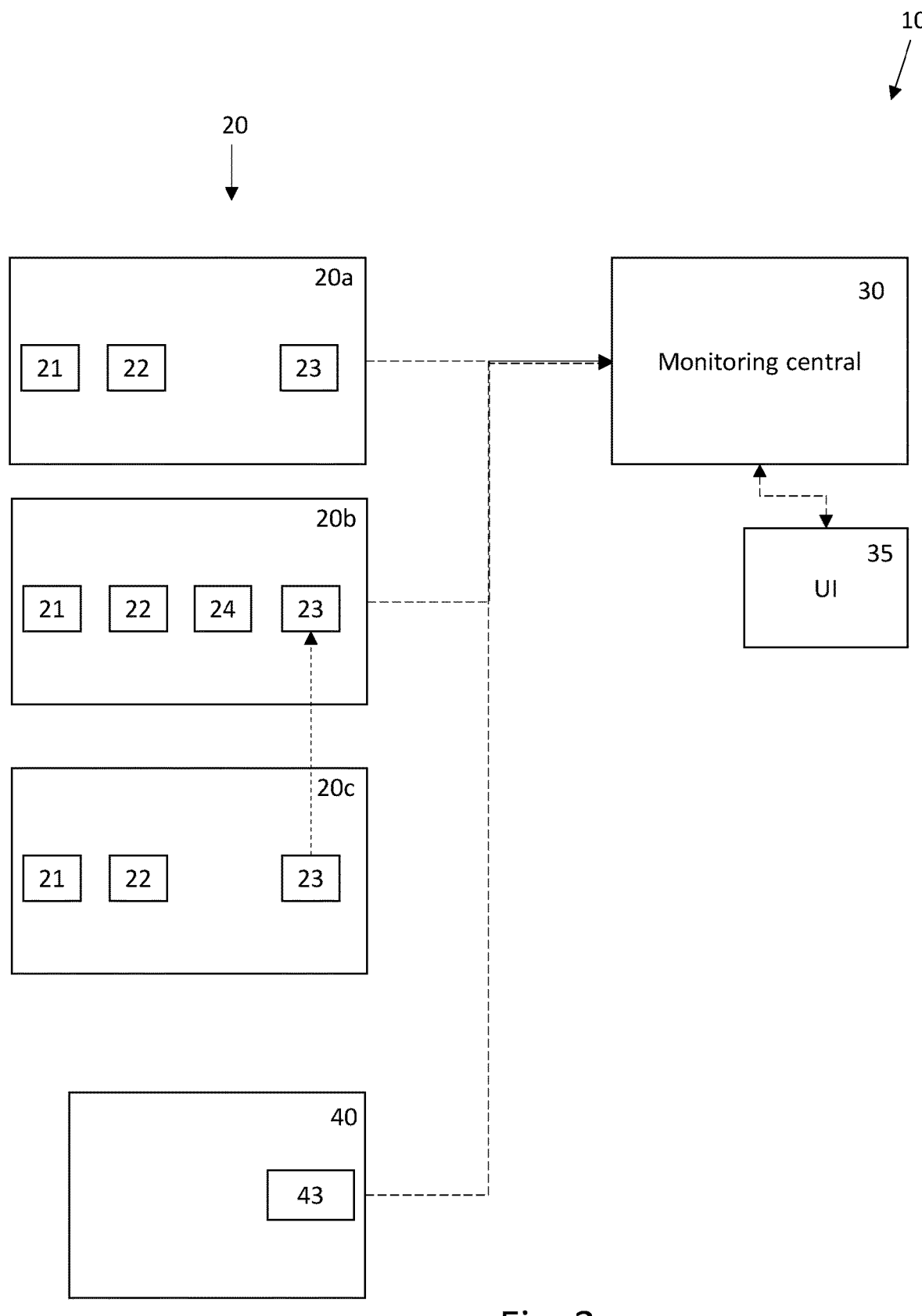
FIG. 3 illustrates a monitoring system of the spare part system schematically.

In FIG. 2 and FIG. 3, it is shown that the spare part system 1 comprises a monitoring system 10 for monitoring the status of the first set of spare parts 110 and the second set of spare parts 120. The monitoring system 10 comprises one or several monitoring units 20, a monitoring central 30 and a user interface 35. The monitoring unit 20 is stored in the container 130 together with the spare parts.

The monitoring unit 20 is provided in communication with the monitoring central 30, and the monitoring central 30 is provided in communication with the user interface 35. The monitoring unit 20 has a unique identifier. When spare parts are put in the container, the unique identifier of the monitoring unit 20 is registered in the monitoring central 30 together with information about the spare parts.

Three different monitoring units 20 are described in FIG. 3, these will be referred to as a first or upper monitoring unit 20a, a second or intermediate monitoring unit 20b and a third or lower monitoring unit 20c.

The first monitoring unit 20a comprises a sensor 21, a power supply 22 and a communication unit 23. The sensor 21 will be described further in detail in examples below. The power supply 22 is supplying power to the sensor 21 and the communication unit 23. The communication unit 23 is provided in communication with the monitoring central 30. It should be noted that here, a parameter sensed by the sensor 21 are sent unprocessed to the monitoring central 30.

The second monitoring unit 20b is substantially similar to the first monitoring unit 20. In addition, the second monitoring unit 20b comprises a processing unit 24 connected to the sensor 21 and the communication unit 23. Here, a parameter sensed by the sensor 21 may be processed and then sent to the monitoring central 30. The power supply 22 is here supplying power to the sensor 21, the communication unit 23 and the processing unit 24.

The third monitoring unit 20c is also substantially similar to the first monitoring unit 20a. However, the communication unit 23 of the third monitoring unit 20c is not communicating directly with the monitoring central. Instead, the communication unit 23 of the lower monitoring unit 20c is a short range communicating unit for communicating with the communication unit 23 of the second monitoring unit 20b, as indicated by the dashed arrow.

In the above examples, the power supply 22 is a battery or a rechargeable battery with a minimum expected operation time T22 (shown in FIG. 5).

The monitoring central 30 is in the present embodiment a cloud-based type of infrastructure. Alternatively, the monitoring central 30 may be a computer type of infrastructure or a server type of infrastructure.

The user interface 35 will typically be a computer such as a desktop computer, a laptop etc. The user interface 35 may also be a smart phone, a tablet etc. Of course, several user interfaces 35 can be connected to the monitoring central 30 simultaneously.

Figure 4:
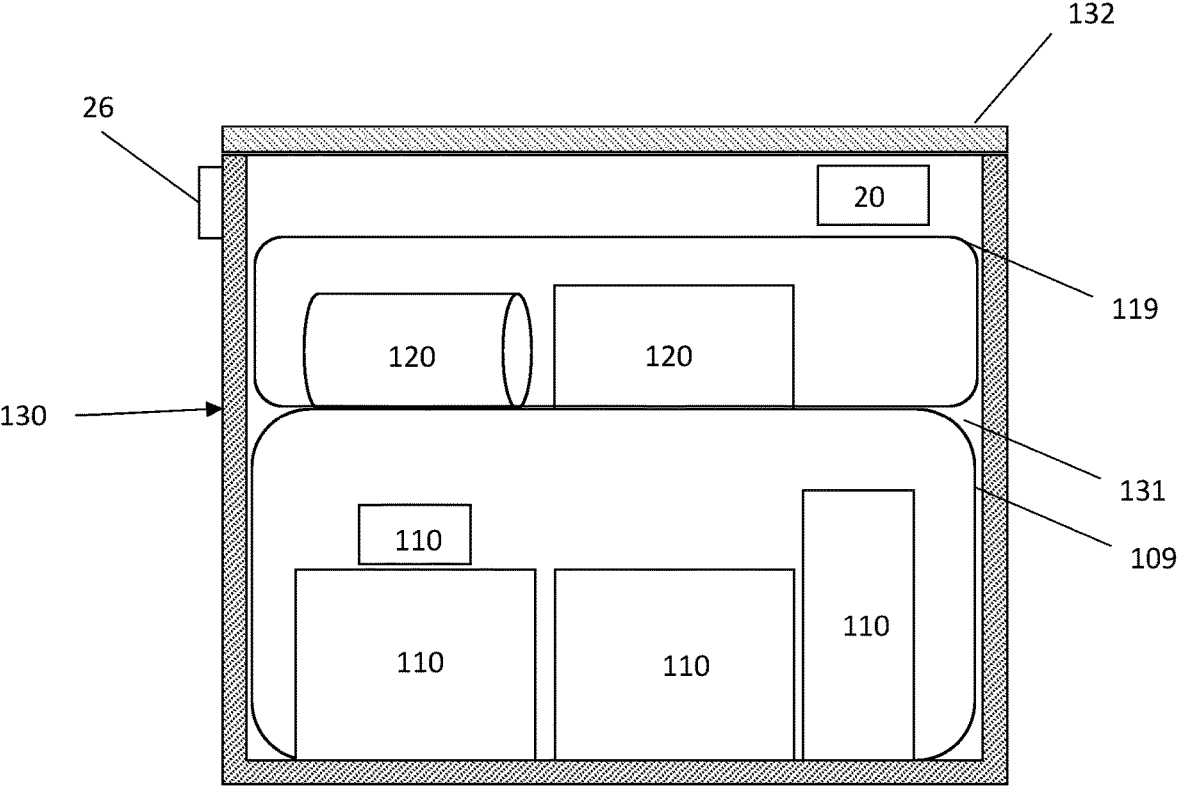
FIG. 4 illustrates a container in which spare parts are stored, together with a sensor of the monitoring system.

It is now referred to FIGS. 2 and 4. In FIG. 4 it is shown that the container 130 defines a storage compartment 131 having a top opening and a lid 132 for covering the top opening. Within the container 130, the first set of spare parts 110 and the second set of spare parts 120 are be stored together. The first set of spare parts 110 will typically be stored in the bottom of the container 130, while the second set of spare parts 120 will be stored above or next to the first set of spare parts 110. Hence, during resupply of the second set of spare parts 120, there is no need to move the first set of spare parts 110 in order to access the second set of spare parts 120.

As shown in FIG. 4, the first set of spare parts 110 is stored within a first bag 109 within the container 130. The second set of spare parts 120 are stored within a second bag 119 within the container 130. These bags 109/119 may be gastight and/or watertight in order to protect the first set of spare parts 110 and the second set of spare parts 120.

It should be noted that some containers 130 may only comprise the first set of spare parts 110 and other containers 130 may only comprise the second set of spare parts 120. However, as in the land joint JT example above, both the first set of spare parts 110 and the second set of spare parts 120 will be required to repair this land joint.

Here, it should be noted that when a fault is detected in such a land joint, it may be required to replace the entire land joint with a new one. For the sake of efficiency, spare parts needed for the repair should be located near each other.

In FIG. 4 it is further shown that the monitoring system 10 comprises an electronic label 26 located on the outside of the container 130. Hence, even though the monitoring unit 20 is located within the container 130, the label 26 is available for example for a person. In the present embodiment, the electronic label 26 is provided in communication with the monitoring unit 20 and has a display configured to display an image containing text, numbers, a QR code etc. enabling a person to identify the content of the container 130.

In FIG. 3 it is further shown that the monitoring system 10 comprises an interrogation unit 40 comprising a communication unit 43 for communication with the monitoring central 30. The interrogation unit 40 further comprises a reader for reading the QR code etc. The interrogation unit 40 may be a smart phone, a tablet or a tailor-made interrogation unit. By means of the interrogation unit 40, a person may search for a specific container, whereupon a signal is sent to the electronic label 26, causing the electronic label 26 to display a visible signal, such as a blinking signal etc.

It is now referred to FIG. 5, illustrating a method for maintaining availability of spare parts for an electric power supply system PSS. In a first step, the first set of spare parts 110 and the second set of spare parts 120 are stored at a desired location, in the present embodiment within the container 130.

In a next step, the first remaining lifespan time T1 for the first set of spare parts 110 and the second remaining lifespan time T2 for the second set of spare parts 120 are determined. Typically, this is information received from the manufacturer of the spare parts. As described above, the second remaining lifespan time T2 is shorter than the first remaining lifespan time T1.

In a next step, the monitoring unit 20 is stored together with first set of spare parts 110 and the second set of spare parts 120 within the container 130.

In a next step, the power supply 22 of the monitoring unit 20 is selected to be capable of supplying power to the monitoring unit 20 for a minimum expected operation time T22 being longer than the second remaining lifespan time T2.

In a next step, the monitoring central 30 is provided in communication with the monitoring unit 20.

In a final step, a message is sent from the monitoring unit 20 to the monitoring central 30 if a condition is present.

Below, some examples of conditions will be described with reference to different types of sensors 21. In general, the condition is that the parameter sensed by the sensor 21 is above or below a threshold value, where the message contains information about this condition either with or without information about the parameter itself. It should be noted that the parameter sensed by the sensor 21 is one single measurement or several measurements as a function of time.

The monitoring unit 20 may comprise one of, or several of these sensors. It should be noted that one type of sensor 21 may be used for more than one purpose.

Sensor Example 1

In this example, the sensor 21 is a position sensor for sensing a parameter representative of a position of the first set of spare parts 110 and/or the second set of spare parts 120.

In case the sensor 21 is a position sensor in the form of a GPS sensor, the threshold value may be a geographic area. If the position sensed by the sensor 21 is outside of the geographic area, a message is sent to the monitoring central.

In most situations, this measurement is used to confirm that the container 130 has arrived at its location after transportation. However, this measurement may also indicate theft and may be used to localize the container 130 after being stolen.

Due to the message sent to the monitoring central, it is possible to determine if theft has occurred, and to plan resupply of spare parts in order to maintain the availability of spare parts.

Sensor Example 2

In this example, the sensor 21 is a movement sensor for sensing a parameter representative of a movement of the first set of spare parts 110 and/or the second set of spare parts 120.

In case the sensor 21 is a movement sensor in the form of an inclinometer, the threshold value may be an inclination value or an averaged inclination value. If the movement sensed by the sensor 21 is above the inclination value or the averaged inclination value, a message is sent to the monitoring central.

Also here the movement sensor may be a GPS sensor. Alternatively, or in addition, the movement sensor may comprise a gyroscope or an accelerometer.

Also this measurement can be used to determine if theft has occurred.

Sensor Example 3

In this example, the sensor 21 is a tampering sensor for sensing a parameter representative of tampering of the first set of spare parts 110 and/or the second set of spare parts 120.

In case the sensor 21 is a tampering sensor in the form of a switch for detecting if the lid 132 has been removed from the container 130, the threshold value may be Boolean value. If the Boolean value of the switch changes, a message is sent to the monitoring central. The tampering sensor may be also be an IR sensor, an ultrasonic sensor, a light sensor, an electrical switch, a proximity switch or a mechanical switch.

Due to the message sent to the monitoring central, it is possible to perform a closer inspection of the spare parts subjected to possible tampering, and to plan resupply of spare parts in order to maintain the availability of spare parts.

Sensor Example 4

In this example, the sensor 21 is an environment sensor for sensing a parameter representative of the storage environment of the first set of spare parts 110 and/or the second set of spare parts 120.

In case the sensor 21 is an environment sensor in the form of a temperature sensor, the threshold value may be a temperature threshold or an average temperature threshold. If the temperature sensed by the sensor 21 is above or below the temperature threshold or the average temperature threshold, a message is sent to the monitoring central. The environment sensor may also or alternatively comprise a humidity sensor.

This measurement may be used to monitor the storage environment which may affect the first remaining lifespan time T1 or the second lifetime span T2.

Due to the message sent to the monitoring central, it is now possible to plan an earlier resupply of spare parts in order to maintain the availability of spare parts.

Sensor Example 5

In this example, the sensor 21 is a shock sensor for sensing a parameter representative of a shock experienced by the first set of spare parts 110 and/or the second set of spare parts 120. The shock sensor is primarily used to measure if there is a risk that the spare parts has been damaged due to a sudden impact, such as a drop from a height above ground, a vehicle crashing into the spare parts etc.

In case the sensor 21 is a shock sensor in the form of an acceleration sensor, the threshold value may be an acceleration threshold or an averaged acceleration threshold. If the acceleration sensed by the sensor 21 is above the acceleration threshold or the averaged acceleration threshold, a message is sent to the monitoring central. The shock sensor may be a drop sensor for sensing a drop of the sensor.

Due to the message sent to the monitoring central, it is now possible to perform a closer inspection of the possibly damaged spare parts and to plan resupply of spare parts in order to maintain the availability of spare parts.

Sensor Example 6

Figure 6:
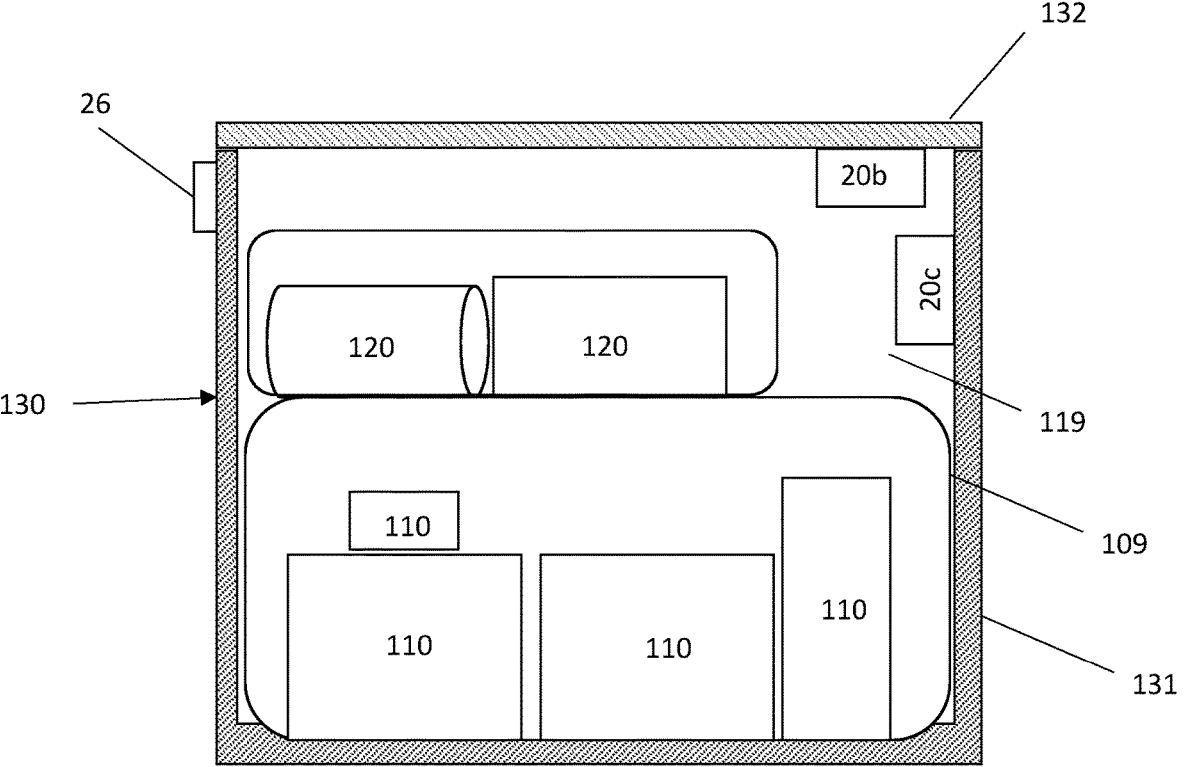
FIG. 6 illustrates a container in which spare parts are stored, together with multiple monitoring units.

It is now referred to FIG. 6. In this example, there are two monitoring units in the form of a second monitoring unit 20b and a third monitoring unit 20c as described above, i.e. where the third monitoring unit 20c is communicating via the second monitoring unit 20b. Both monitoring units 20b, 20c have sensors in the form of accelerometers.

In this case the monitoring units are used together as a tampering sensor as the third monitoring unit 20c is attached to the inside of the container 130 and the second monitoring unit 20b is attached to the lid 132. A difference in inclination or a different movement measured by these monitoring units would indicate that the lid 132 has been removed from the container 130. If the movement or inclination of the two monitoring units are different, a message is sent to the monitoring central. An equal value of inclination or mutual position would instead indicate that the whole container is e.g. rightfully repositioned within the warehouse during normal management operations.

As above, due to the message sent to the monitoring central, it is possible to perform a closer inspection of the spare parts subjected to possible tampering, and to plan resupply of spare parts in order to maintain the availability of spare parts.

Further Examples

The second spare parts 120 must be resupplied when their remaining lifespan time T2 ends. Then the containers 130 are opened, and the second spare parts 120 are replaced with new spare parts while the first spare parts 110 remains within the container 130. By replacing the power supply 22 of the monitoring unit 20 at the same time the container is opened for resupply, a more efficient spare part system is achieved. The power supply 22 may be replaced every time, every second time or every third time the second spare parts 120 are to be resupplied.

The spare part system 1 may comprise a third set of spare parts having a third remaining lifespan time T3 being shorter than the first remaining lifespan time T1 and longer than the second remaining lifespan time T2.

During resupply and change of power supply, the interrogation unit 40 or the user interface 35 is used to update the information about the spare parts and the monitoring unit 20 for each container being opened.

ALTERNATIVE EMBODIMENTS

In an alternative embodiment, the interrogation unit 40 may be used for local interrogation of the monitoring unit 20.

In an alternative embodiment, the electronic label 26 is a Near Field Communication (NFC) tag and the interrogation unit 40 is an NFC reader. When spare parts are put in the container, the NFC tag together with the unique identifier of the monitoring unit 20 are registered in the monitoring central 30.

In a further embodiment, the condition is a point of time, where the monitoring unit 20 is configured to send a message to the monitoring central 30 at a point of time. The message may here comprise information about the parameters sensed by the sensor 21. It should be noted that this embodiment may be combined with the above embodiment, i.e. that one type of message is sent at a point of time even if the parameter sensed by the sensor is not above or below a threshold value and a second type of message is sent in case the parameter sensed by the sensor is above or below a threshold value.

The time may be measured by a timer within the processing unit 24, a timer within the sensor 21 or a timer within the communication unit 23.

In a further embodiment, the condition is that a remaining operation time for the power supply 22 is less than the expected remaining operation time for the power supply 22. This condition may be detected due to a fault in the power supply 22 or by detecting that the energy level of the power supply 22 is below a threshold value. Again, it should be noted that this embodiment may be combined with the above embodiments.

LIST OF REFERENCE NUMBERS

1 spare part system
10 monitoring system
20 monitoring unit
20a upper/first monitoring unit
20b intermediate/second monitoring unit
20c lower/third monitoring unit
21 sensor
22 power supply
23 communication unit
24 processing unit
26 electronic label
30 monitoring central
35 user interface
40 interrogation unit
43 communication unit
109 first bag
110 first set of spare parts
119 second bag
120 second set of spare parts
130 container
131 storage compartment
132 closure/lid
PSS electric power supply system
T1 first remaining lifespan time
T2 second remaining lifespan time
T22 minimum expected operation time
T3 third remaining lifespan time
TB termination body
TC termination scaffold
TH field shaping termination hat
TP termination plate

The invention claimed is:

1. A spare part system for maintaining availability of spare parts for an electric power supply system, wherein the spare part system comprises:

a first set of spare parts having a first remaining lifespan time;

a second set of spare parts having a second remaining lifespan time being shorter than the first remaining lifespan time;

a monitoring system for monitoring the status of the first set of spare parts and the second set of spare parts;

wherein the monitoring system comprises:

a monitoring unit located together with the first set of spare parts and the second set of spare parts; wherein the monitoring unit comprises a sensor and a communication unit;

a monitoring central provided in communication with the communication unit of the monitoring unit;
wherein the monitoring unit is configured to send a message to the monitoring central if a condition is present,
wherein the monitoring unit comprises a power supply, wherein the power supply is defined with a minimum expected operation time for which the power supply is capable of powering the monitoring unit and the minimum expected operation time for the power supply is 1-3 times the second remaining lifespan time.

2. The spare part system according to claim 1, wherein the first set of spare parts is stored within a container, wherein the second set of spare parts is stored separately from the first set of spare parts within the container, wherein the monitoring unit is located adjacent to the second set of spare parts within the container.

3. The spare part system according to claim 2, wherein the container is defining a storage compartment having a top opening and wherein the container comprises a closure for covering the top opening, wherein the monitoring unit is accessible via the top opening when the closure is removed from the container.

4. The spare part system according to claim 3, wherein the sensor is one or more of the following:
   a position sensor for sensing a parameter representative of a position of the first set of spare parts and/or the second set of spare parts; or
   a movement sensor for sensing a parameter representative of a movement of the first set of spare parts and/or the second set of spare parts; or
   a tampering sensor for sensing a parameter representative of tampering of the first set of spare parts and/or the second set of spare parts; or
   an environment sensor for sensing a parameter representative of the storage environment of the first set of spare parts and/or the second set of spare parts; or
   a shock sensor for sensing a parameter representative of a shock experienced by the first set of spare parts and/or the second set of spare parts.

5. The spare part system according to claim 4, wherein the message sent from the monitoring unit to the monitoring central comprises the parameter sensed by the sensor.

6. The spare part system according to claim 4, wherein the condition is that the parameter sensed by the sensor is above or below a threshold value.

7. The spare part system according to claim 1, wherein the condition is a point of time.

8. The spare part system according to claim 1, wherein the monitoring system comprises an electronic label located at an available location together with the first set of spare parts and the second set of spare parts, wherein the electronic label is provided in communication with the monitoring unit.

9. The spare part system according to claim 8, wherein the monitoring system comprises an interrogation unit for local interrogation of the monitoring unit and/or the electronic label.

10. The spare part system according to claim 1, wherein the condition is that an actual remaining operation time for the power supply is less than the expected remaining operation time for the power supply.

11. The spare part system according to claim 1, wherein the monitoring unit comprises a processing unit connected to the sensor and the communication unit, wherein the power supply is supplying power to the processing unit.

12. A method for maintaining availability of spare parts for an electric power supply system, wherein the method comprises the steps of:
   storing a first set of spare parts;
   storing a second set of spare parts together with the first set of spare parts;
   determining a first remaining lifespan time for the first set of spare parts;
   determining a second remaining lifespan time for the second set of spare parts, wherein the second remaining lifespan time is shorter than the first remaining lifespan time;
   storing a monitoring unit comprising a sensor and a communication unit together with the first set of spare parts and the second set of spare parts;
   selecting a power supply for the monitoring unit suitable for supplying power to the monitoring unit for a minimum expected operation time being 1-3 times the second remaining lifespan time;
   providing a monitoring central in communication with the monitoring unit; and
   sending a message from the monitoring unit to the monitoring central if a condition is present.

* * * * *